(12) United States Patent
Karuppiah et al.

(10) Patent No.: US 12,232,249 B2
(45) Date of Patent: Feb. 18, 2025

(54) SYSTEMS AND METHODS FOR VISUALLY IDENTIFYING EQUIPMENT IN A DATA CENTER

(71) Applicant: Dell Products L.P., Round Rock, TX (US)

(72) Inventors: Kannan Karuppiah, Fremont, CA (US); Shree Rathinasamy, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 737 days.

(21) Appl. No.: 17/224,907

(22) Filed: Apr. 7, 2021

(65) Prior Publication Data

US 2022/0330419 A1    Oct. 13, 2022

(51) Int. Cl.
| | |
|---|---|
| *H05K 5/00* | (2006.01) |
| *G06F 1/16* | (2006.01) |
| *H05K 1/02* | (2006.01) |
| *H05K 5/02* | (2006.01) |
| *H05K 7/14* | (2006.01) |

(52) U.S. Cl.
CPC .............. *H05K 1/0269* (2013.01); *G06F 1/16* (2013.01); *H05K 5/0252* (2013.01); *H05K 7/1498* (2013.01); *H05K 2201/10053* (2013.01)

(58) Field of Classification Search
None
See application file for complete search history.

(56) References Cited

U.S. PATENT DOCUMENTS

| | | | | |
|---|---|---|---|---|
| 2009/0153002 | A1* | 6/2009 | Kinoshita | B60R 11/0205 312/223.1 |
| 2013/0279129 | A1* | 10/2013 | Xie | G06F 1/16 361/752 |

* cited by examiner

*Primary Examiner* — Imani N Hayman
*Assistant Examiner* — Rashen E Morrison
(74) *Attorney, Agent, or Firm* — Jackson Walker L.L.P.

(57) ABSTRACT

An information handling system may include a processor and a flag assembly comprising a flag and an actuator mechanically coupled to the flag and communicatively coupled to the processor, and configured to receive control signals from the processor to mechanically translate the flag between an activated position in which the flag is visually perceptible to a user external to the information handling system and a deactivated position in which the flag is visually imperceptible to the user.

15 Claims, 4 Drawing Sheets

SYSTEMS AND METHODS FOR VISUALLY IDENTIFYING EQUIPMENT IN A DATA CENTER

TECHNICAL FIELD

The present disclosure relates in general to information handling systems, and more particularly to systems and methods for providing a transceiver module with an integrated visual indicator for port link and activity.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may have a network interface or other input/output (I/O) interface configured to receive an optical transceiver module (e.g., a small form-factor pluggable (SFP) transceiver or a quad small form-factor pluggable (QSFP) transceiver of any I/O speed). Such transceiver modules often plug into "cages" disposed on an I/O interface card, which often reside in the rear of the information handling system.

In a data center environment, it may be necessary to identify a switch. For example, it may be necessary to identify a "front" of a switch to make a data port connection, to connect a management port, to connect a cable, or to perform troubleshooting. As another example, it may be desirable to identify a "back" of a switch to replace the switch or to replace a modular component of the switch, such as an air mover (e.g., fan or blower) or power supply unit.

Locating a particular switch device in a data center rack may be difficult, especially with multiple, similar devices located in proximity to one another within a rack.

SUMMARY

In accordance with the teachings of the present disclosure, the disadvantages and problems associated identifying a switch or other information handling system in a data center environment may be reduced or eliminated.

In accordance with embodiments of the present disclosure, an information handling system may include a processor and a flag assembly comprising a flag and an actuator mechanically coupled to the flag and communicatively coupled to the processor, and configured to receive control signals from the processor to mechanically translate the flag between an activated position in which the flag is visually perceptible to a user external to the information handling system and a deactivated position in which the flag is visually imperceptible to the user.

In accordance with these and other embodiments of the present disclosure, a method may include, in an information handling system comprising a processor and a flag assembly comprising a flag and an actuator mechanically coupled to the flag and communicatively coupled to the processor: receiving, by the actuator, control signals from the processor; and responsive to the control signal, mechanically translating, by the actuator, the flag between an activated position in which the flag is visually perceptible to a user external to the information handling system and a deactivated position in which the flag is visually imperceptible to the user.

In accordance with these and other embodiments of the present disclosure, a method may include communicatively coupling an actuator to a processor such that the actuator is configured to receive control signals from the processor and mechanically coupling a flag to an actuator, such that the actuator is configured to, in response to the control signals, mechanically translate the flag between an activated position in which the flag is visually perceptible to a user external to an information handling system comprising the processor and a flag assembly comprising the flag and the actuator and a deactivated position in which the flag is visually imperceptible to the user.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
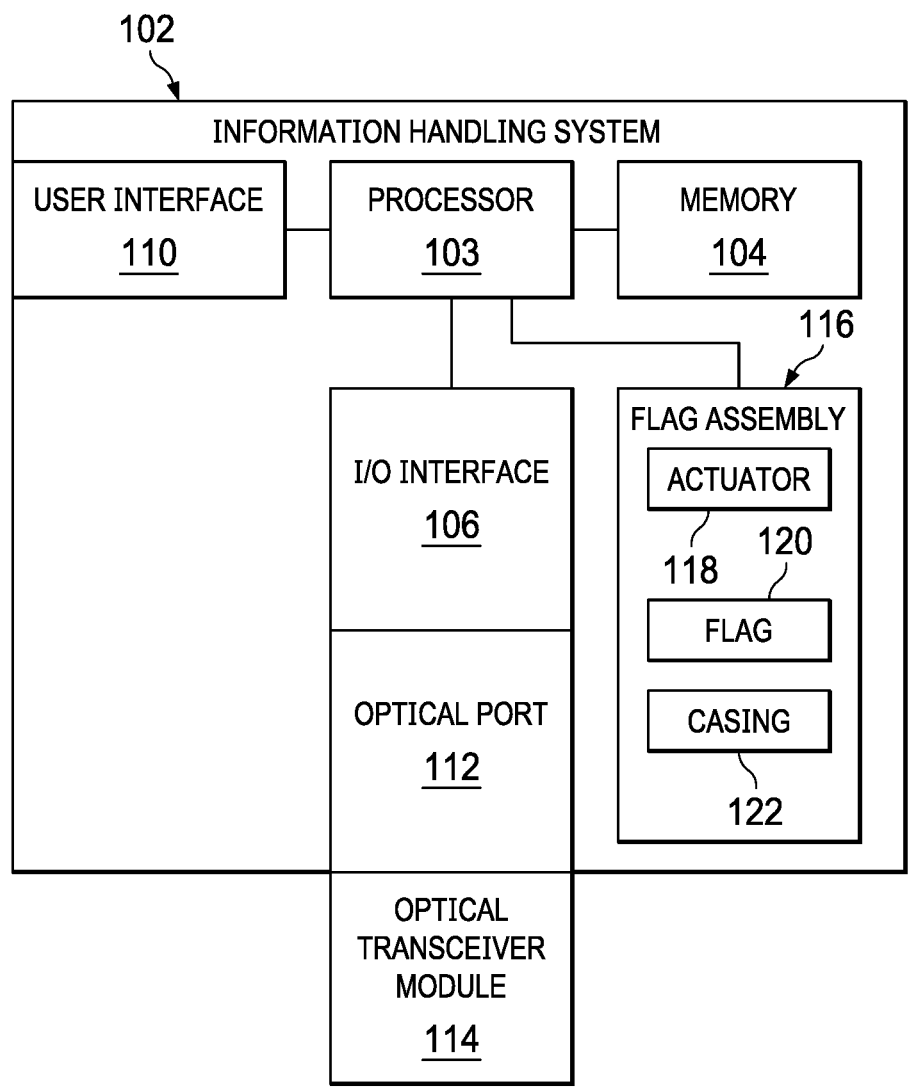
FIG. 1 illustrates a block diagram of selected components of an example information handling system, in accordance with embodiments of the present disclosure.

Preferred embodiments and their advantages are best understood by reference to FIGS. 1 through 5B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a functional block diagram of selected components of an example information handling system 102, in accordance with embodiments of the present disclosure. In some embodiments, information handling system 102 may be a personal computer (e.g., a desktop computer or a portable computer). In other embodiments, information handling system 102 may comprise a storage server for archiving data. In yet other embodiments, information handling system 102 may comprise a server. In further embodiments, information handling system 102 may comprise a network switch.

As depicted in FIG. 1, information handling system 102 may include a processor 103, a memory 104 communicatively coupled to processor 103, an input/output interface 106 communicatively coupled to processor 103, a user interface 110 communicatively coupled to processor 103, an optical port 112 communicatively coupled to I/O interface 106, and a flag assembly 116 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, and/or another component of information handling system 102.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 102 is turned off.

I/O interface 106 may comprise any suitable system, apparatus, or device operable to serve as an interface between information handling system 102 and one or more other external devices. For example, in some embodiments, I/O interface 106 may comprise a network interface configured to serve as an interface between information handling system 102 and information handling systems via a network, in which case I/O interface 106 may comprise a network interface card, or "NIC."

User interface 110 may comprise any instrumentality or aggregation of instrumentalities by which a user may interact with information handling system 102. For example, user interface 110 may permit a user to input data and/or instructions into information handling system 102, and/or otherwise manipulate information handling system 102 and its associated components. User interface 110 may also permit information handling system 102 to communicate data to a user, e.g., by way of a display device.

Optical port 112 may comprise an electrical connector in the form of any suitable combination of a jack, a socket, and/or "cage" for receiving a corresponding connector of an optical transceiver module 114.

Optical transceiver module 114 may include any system, device, or apparatus that houses and includes an optical transceiver configured to convert an incoming optical signal into an equivalent electrical signal, and communicate such equivalent electrical signal to I/O interface 106, and also configured to receive an electrical signal from I/O interface 106, convert such electrical signal into an equivalent optical signal, and communicate such optical signal as an outgoing optical signal (e.g., via an optical cable, which may be integral to the same assembly as optical transceiver module 114). Optical transceiver module 114 may include an SFP transceiver, a QSFP transceiver, or any other suitable form factor.

Flag assembly 116 may include any system, device, or apparatus comprising a mechanical actuator 118 configured to mechanically translate a visual indicator, also referred to herein as flag 120, from a deactivated position in which flag 120 is not visible to a user from the exterior of information handling system 102, to an activated position in which flag 120 is visible to a user from the exterior of information handling system 102, and vice versa. As described in greater detail below, a user (e.g., via a management console communicatively coupled to information handling system 102 via a network) may issue a command (e.g., via a command-line interface) to processor 103 to activate or deactivate flag 120, and processor 103 may in turn communicate a control signal to flag assembly 116 to activate or deactivate flag 120 in accordance with the control signal.

As further shown in FIG. 1, flag assembly 116 may also include a casing 122 for covering flag 120 to protect flag 120 from interfering with cabling or other wiring associated with information handling system 102. So that flag 120 remains visible through casing 122, casing 122 may be formed from an optically-transmissive (e.g., transparent) material, such as acrylic.

Although FIG. 1 depicts information handling system 102 having only a single optical port 112 and single optical transceiver module 114, in many embodiments, especially in those in which information handling system 102 is a network switch, information handling system 102 may have a plurality of optical ports 112, each optical port 112 configured to receive an optical transceiver module 114.

In addition to processor 103, memory 104, I/O interface 106, user interface 110, optical port 112, optical transceiver module 114, and flag assembly 116, information handling system 102 may include one or more other information handling resources. Such an information handling resource may include any component system, device or apparatus of an information handling system, including without limitation, a processor, bus, memory, I/O device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 2:
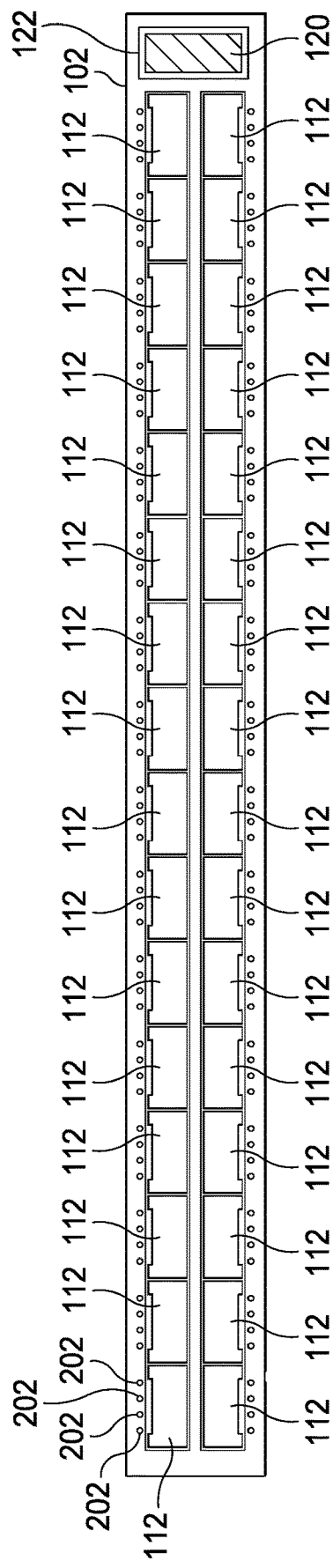
FIG. 2 illustrates an elevation view of a front panel of an example information handling system, in accordance with embodiments of the present disclosure.

FIG. 2 illustrates an elevation view of a front panel of an example information handling system 102, in accordance with embodiments of the present disclosure. In particular, FIG. 2 illustrates a front panel of an information handling system 102 implemented as a network switch. As shown in FIG. 2, information handling system 102 may have a plurality of optical ports 112, and one or more visual indicators 202 (e.g., four visual indicators 202 in the embodiments represented by FIG. 2) associated with each optical port 112. Each visual indicator 202 may comprise any system, device, or apparatus configured to emit light or other visual stimulus to indicate to a person a status (e.g., link connection status, link connection speed, etc.) associated with its associated optical port 112. For example, in some embodiments, each visual indicator 202 may comprise a light-emitted diode (LED). In some embodiments, each visual indicator 202 may have two possible visual states (e.g., on or off indicating whether a link associated with an optical port 112 is active or inactive). In other embodiments, each visual indicator 202 may have three or more possible visual states (e.g., on or off indicating whether a link associated with an optical port 112 is active or inactive, and different colors to indicate connection speed).

As also shown in FIG. 2, when a flag 120 is activated, such flag 120 may be visible through a casing 122 to a user viewing the front panel of information handling system 102.

Figure 3:
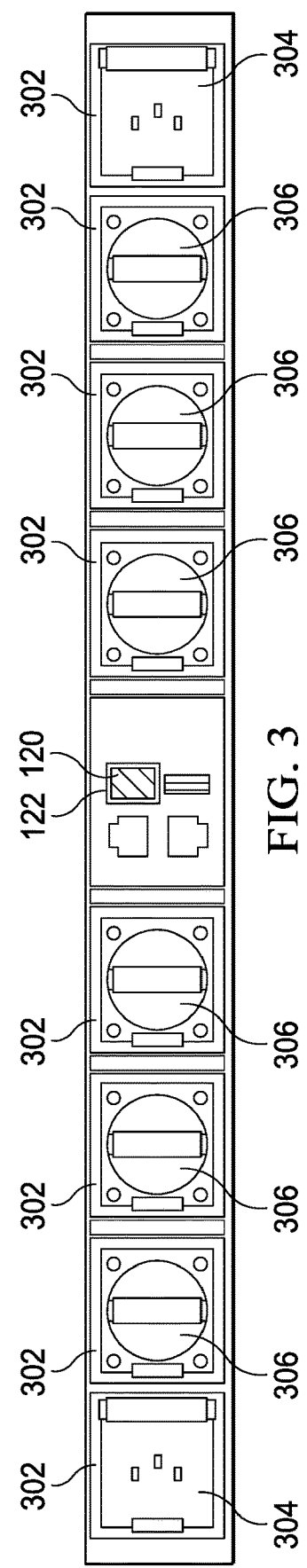
FIG. 3 illustrates an elevation view of a rear panel of an example information handling system, in accordance with embodiments of the present disclosure.

FIG. 3 illustrates an elevation view of a rear panel of an example information handling system 102, in accordance with embodiments of the present disclosure. In particular, FIG. 3 illustrates a rear panel of an information handling system 102 implemented as a network switch. As shown in FIG. 3, information handling system 102 may have a plurality of bays 302 each configured to receive a modular component, such as a power supply unit 304 or an air mover 306 (e.g., a fan or a blower). As also shown in FIG. 3, when a flag 120 is activated, such flag 120 may be visible through a casing 122 to a user viewing the rear panel of information handling system 102.

In some embodiments, an information handling system 102 may include a flag assembly 116 configured such that when a flag 120 is activated, such flag 120 may be visible from a front panel but not a rear panel of information handling system 102. In other embodiments, an information handling system 102 may include a flag assembly 116 configured such that when a flag 120 is activated, such flag 120 may be visible from a rear panel but not a front panel of information handling system 102. In yet other embodiments, an information handling system 102 may include multiple flag assemblies 116, including a first flag assembly 116 configured such that when a flag 120 is activated, such flag 120 may be visible from a front panel but not a rear panel of information handling system 102, and further including a second flag assembly 116 configured such that when a flag 120 is activated, such flag 120 may be visible from a rear panel but not a front panel of information handling system 102.

Figure 4A:
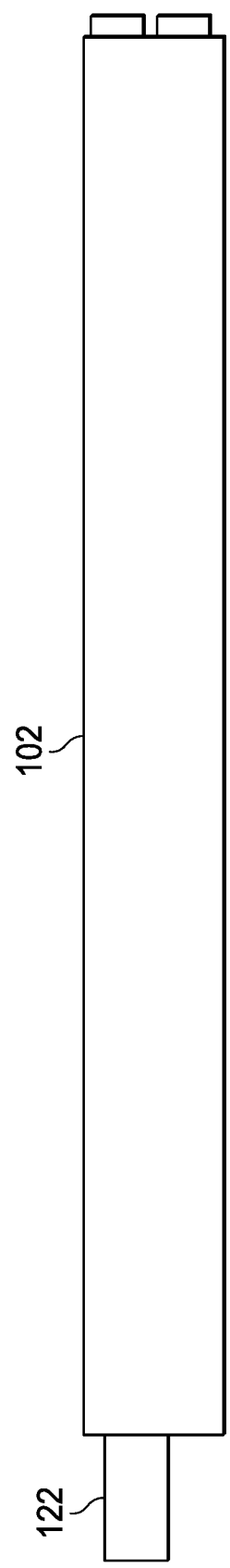
FIG. 4A illustrates an elevation view of a side of an example information handling system with a flag deactivated, in accordance with embodiments of the present disclosure.
Figure 4B:
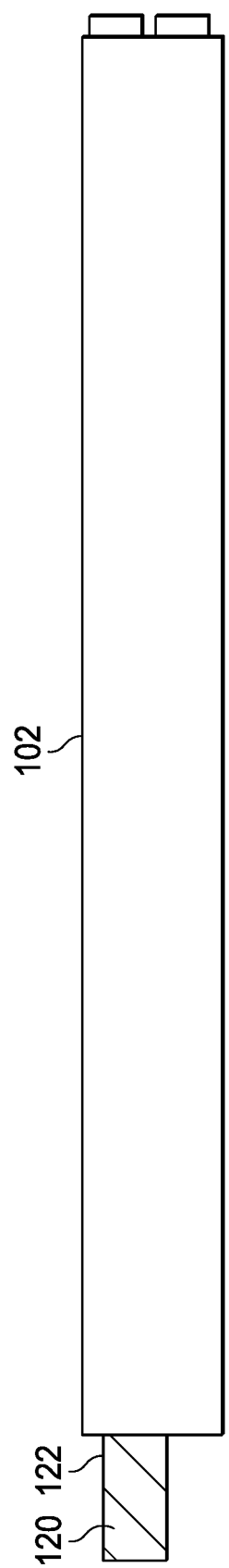
FIG. 4B illustrates an elevation view of a side of an example information handling system with a flag activated, in accordance with embodiments of the present disclosure.

FIG. 4A illustrates an elevation view of a side of example information handling system 102 with a flag 120 deactivated, in accordance with embodiments of the present disclosure. Similarly, FIG. 4B illustrates an elevation view of a side of example information handling system 102 with such flag 120 activated, in accordance with embodiments of the present disclosure. As shown in FIGS. 4A and 4B, casing 122 may extend at least partially from a front panel or back panel of information handling system 102, such that when flag 120 is activated, flag 120 may be visible through casing 122 from a side of information handling system 102, thus enabling ease of identification of information handling system 102.

Figure 5A:
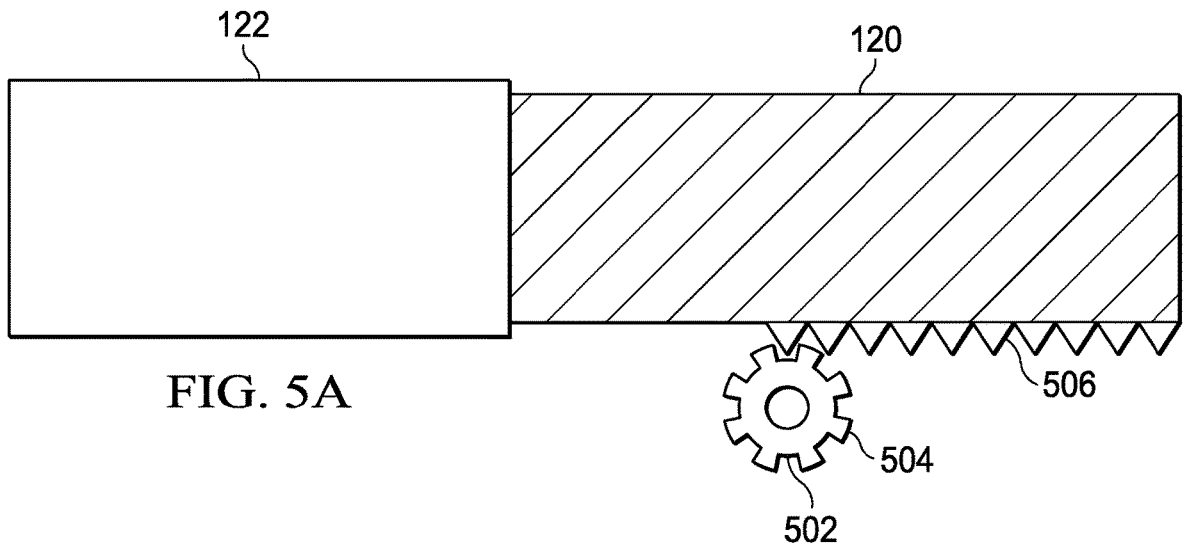
FIG. 5A illustrates selected components of a flag assembly with a flag in a deactivated state, in accordance with embodiments of the present disclosure.

FIG. 5A illustrates selected components of flag assembly 116 with flag 120 in a deactivated state, in accordance with embodiments of the present disclosure. Similarly, FIG. 5B illustrates selected components of flag assembly 116 with flag 120 in an activated state, in accordance with embodiments of the present disclosure.

Figure 5B:
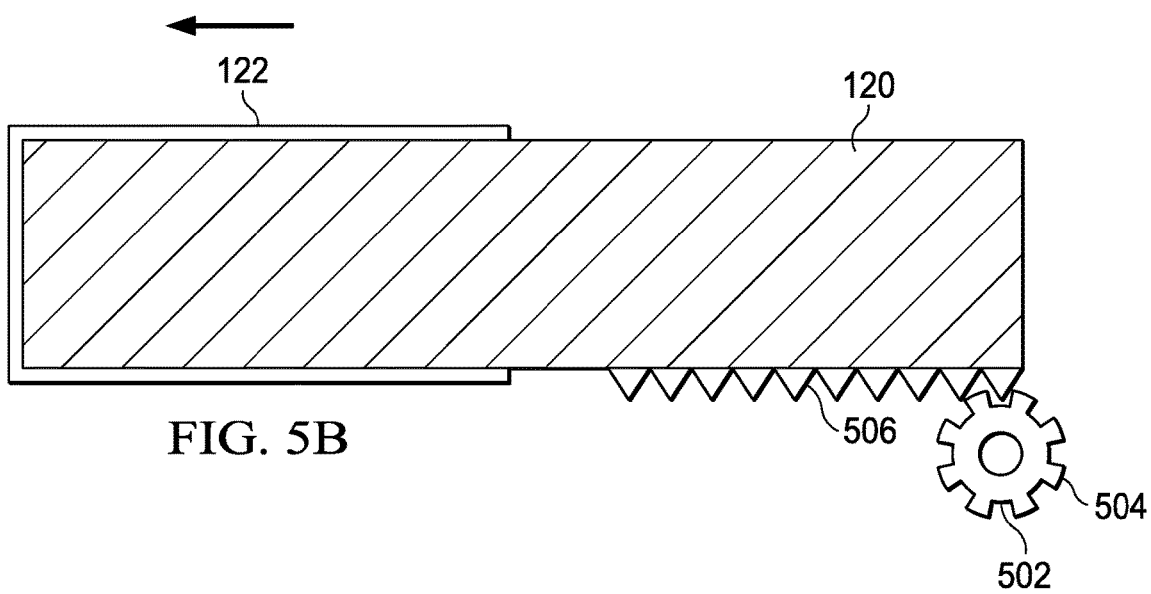
FIG. 5B illustrates selected components of a flag assembly with a flag in an activated state, in accordance with embodiments of the present disclosure.

As shown in FIGS. 5A and 5B, in some embodiments, actuator 118 may be implemented with a mechanical motor configured to rotate (in accordance with control signals from processor 103) a gear 502 having gear teeth 504, such that as gear 502 rotates, gear teeth 504 mechanically interact with corresponding linearly-arranged teeth 506 coupled to flag 120 to transfer torque from gear 502 to flag 120 to cause linear displacement of flag 120, to linearly translate flag 120 between the deactivated position and the activated position.

In some embodiments, the flag assembly 116 disclosed herein may be used in tandem with visual indicators 202 to provide a pattern or collection of visual indications for identifying a particular port 112 and/or information handling system 102.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system, comprising:
   a processor; and
   a visual indicator assembly comprising:
      a visual indicator;
      an actuator mechanically coupled to the visual indicator and communicatively coupled to the processor, and configured to receive control signals from the processor to mechanically translate the visual indicator between:
         an activated position in which the visual indicator is visually perceptible to a user external to the information handling system; and
         a deactivated position in which the visual indicator is visually imperceptible to the user; and
      an optically-transmissive casing for covering the visual indicator such that when the visual indicator is in the activated position, the visual indicator is visually perceptible to the user through the optically-transmissive casing.

2. The information handling system of claim 1, wherein the information handling system is a network switch.

3. The information handling system of claim 1, wherein the optically-transmissive casing extends from either of a front panel or a rear panel of the information handling system such that the visual indicator is visually perceptible to the user from a side of the information handling system perpendicular to the front panel and the rear panel.

4. The information handling system of claim 1, wherein the visual indicator is visually perceptible to the user on a front panel of the information handling system when the visual indicator is in the activated position.

5. The information handling system of claim 1, wherein the visual indicator is visually perceptible to the user on a rear panel of the information handling system when the visual indicator is in the activated position.

6. A method comprising, in an information handling system comprising a processor and a visual indicator assembly comprising a visual indicator and an actuator mechanically coupled to the visual indicator and communicatively coupled to the processor:
   receiving, by the actuator, control signals from the processor; and
   responsive to the control signal, mechanically translating, by the actuator, the visual indicator between:
      an activated position in which the visual indicator is visually perceptible to a user external to the information handling system; and
      a deactivated position in which the visual indicator is visually imperceptible to the user;
   wherein the visual indicator assembly further comprises an optically-transmissive casing for covering the visual indicator such that when the visual indicator is in the activated position, the visual indicator is visually perceptible to the user through the optically-transmissive casing.

7. The method of claim 6, wherein the information handling system is a network switch.

8. The method of claim 7, wherein the optically-transmissive casing extends from either of a front panel or a rear panel of the information handling system such that the visual indicator is visually perceptible to the user from a side of the information handling system perpendicular to the front panel and the rear panel.

9. The method of claim 6, wherein the visual indicator is visually perceptible to the user on a front panel of the information handling system when the visual indicator is in the activated position.

10. The method of claim 6, wherein the visual indicator is visually perceptible to the user on a rear panel of the information handling system when the visual indicator is in the activated position.

11. A method, comprising:
communicatively coupling an actuator to a processor such that the actuator is configured to receive control signals from the processor;
mechanically coupling a visual indicator to an actuator, such that the actuator is configured to, in response to the control signals, mechanically translate the visual indicator between:
an activated position in which the visual indicator is visually perceptible to a user external to an information handling system comprising the processor and a visual indicator assembly comprising the visual indicator and the actuator; and
a deactivated position in which the visual indicator is visually imperceptible to the user; and
covering the visual indicator with an optically-transmissive casing such that when the visual indicator is in the activated position, the visual indicator is visually perceptible to the user through the optically-transmissive casing.

12. The method of claim 11, wherein the information handling system is a network switch.

13. The method of claim 11, wherein the optically-transmissive casing extends from either of a front panel or a rear panel of the information handling system such that the visual indicator is visually perceptible to the user from a side of the information handling system perpendicular to the front panel and the rear panel.

14. The method of claim 11, wherein the visual indicator is visually perceptible to the user on a front panel of the information handling system when the visual indicator is in the activated position.

15. The method of claim 11, wherein the visual indicator is visually perceptible to the user on a rear panel of the information handling system when the visual indicator is in the activated position.

* * * * *